United States Patent [19]
Cheng et al.

[11] Patent Number: 5,739,780
[45] Date of Patent: Apr. 14, 1998

[54] DIGITAL TO ANALOG CONVERTER AND DYNAMIC CURRENT MIRROR STRUCTURE TO SIMPLIFY ON-CHIP WAVE SHAPING

[75] Inventors: Yi Cheng; Thomas Jefferson Runaldue, both of San Jose, Calif.

[73] Assignee: Advanced Micro Devices, Inc., Sunnyvale, Calif.

[21] Appl. No.: 599,653

[22] Filed: Feb. 12, 1996

[51] Int. Cl.$^6$ .................................................. H03M 1/66

[52] U.S. Cl. .......................................... 341/135; 341/143

[58] Field of Search ........................................ 341/135, 143

[56] References Cited

U.S. PATENT DOCUMENTS

| | | | |
|---|---|---|---|
| 5,287,107 | 2/1994 | Gampell et al. | 341/137 |
| 5,379,040 | 1/1995 | Mizomoto et al. | 341/143 |
| 5,396,245 | 3/1995 | Rempfer | 341/145 |

*Primary Examiner*—Jeffrey A. Gaffin
*Assistant Examiner*—Jason H. Vick
*Attorney, Agent, or Firm*—Fliesler, Dubb, Meyer & Lovejoy LLP

[57] ABSTRACT

A digital to analog converter that includes circuitry that converts sequences of positive and negative digital data samples into electrical currents and current mirror circuitry that generates an analog waveform by combining and amplifying the electrical currents.

1 Claim, 5 Drawing Sheets

DIGITAL TO ANALOG CONVERTER AND DYNAMIC CURRENT MIRROR STRUCTURE TO SIMPLIFY ON-CHIP WAVE SHAPING

BACKGROUND OF THE INVENTION

1. Field of Invention

The present invention pertains to the field of digital to analog conversion circuits. More particularly, this invention relates to a digital to analog converter with a dynamic current mirror structure.

2. Art Background

Electronic systems that drive electronic transmission lines may employ wave shaping techniques. Such a wave shaping technique usually includes the synthesis of sinusoidal waveform pulses from stored digital waveform data samples. Such an electronic system typically includes an digital to analog conversion circuit that converts sequences of digital waveform data samples to an analog signal. Typically, such digital waveform data samples provide input codes for the digital to analog conversion circuit.

Some prior electronic systems implement a differential digital to analog conversion circuit. Such differential digital to analog conversion circuits typically include a set of current sources which are coupled to corresponding switching transistors. Typically, the switching transistors are controlled by the input codes to the digital to analog converter. Such a combination of switched current sources yields a sum of electrical currents at output nodes that directly drive a pair of differential output resistors.

Unfortunately, such differential digital to analog converter circuits usually suffer from high power consumption. Typically, the output nodes coupled to the output resistors are biased to a preselected voltage level. Such a preselected bias level is usually selected for maximum dynamic range in the analog output signal. Such biasing usually causes electrical current flow through the output resistors even while the output waveform is inactive. Such quiescent levels of output current unnecessarily consumes power during idle transmission periods.

In addition, such differential digital to analog conversion circuits typically generate high frequency noise through the output resistors. As a consequence, such differential digital analog converters usually include a low pass filter circuit to reduce such high frequency noise. Unfortunately, the extra components of such a low pass filter usually increase the size and the overall cost of such circuits.

Moreover, such differential digital analog converter circuits are typically implemented with relatively large transistors which are capable of delivering sufficient levels of current to the output nodes. Unfortunately, such relatively large transistors increases the integrated circuit die space required to implement the digital analog conversion circuitry which increases overall system costs.

Other digital analog conversion circuits include an operational amplifier configured as a voltage controlled voltage source. Typically, such an operational amplifier samples a low power input signal and generates a continuous signal at the required power to drive the load resistors at the output node. Such operational amplifier designs usually provide a high gain design along with feedback circuitry to provide overall stability. In addition, such operational amplifiers typically require a high gain-bandwidth products to achieve stability. Unfortunately, such a high gain closed loop circuit is inherently unstable and can cause undesirable oscillation in the analog output signal.

SUMMARY AND OBJECTS OF THE INVENTION

One object of the present invention is to provide a digital to analog conversion circuit for on-chip wave shaping.

Another object of the present invention is to provide a relatively low power consumption digital analog conversion circuit without an operational amplifier output stage.

These and other objects are provided by a digital to analog converter that includes circuitry that converts a sequence of positive digital data samples into a first electrical current and circuitry that converts a sequence of negative digital data samples into a second electrical current. The digital to analog converter employs dynamic current mirror circuitry to generate an analog waveform by combining and amplifying the first and second electrical currents.

Other objects, features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
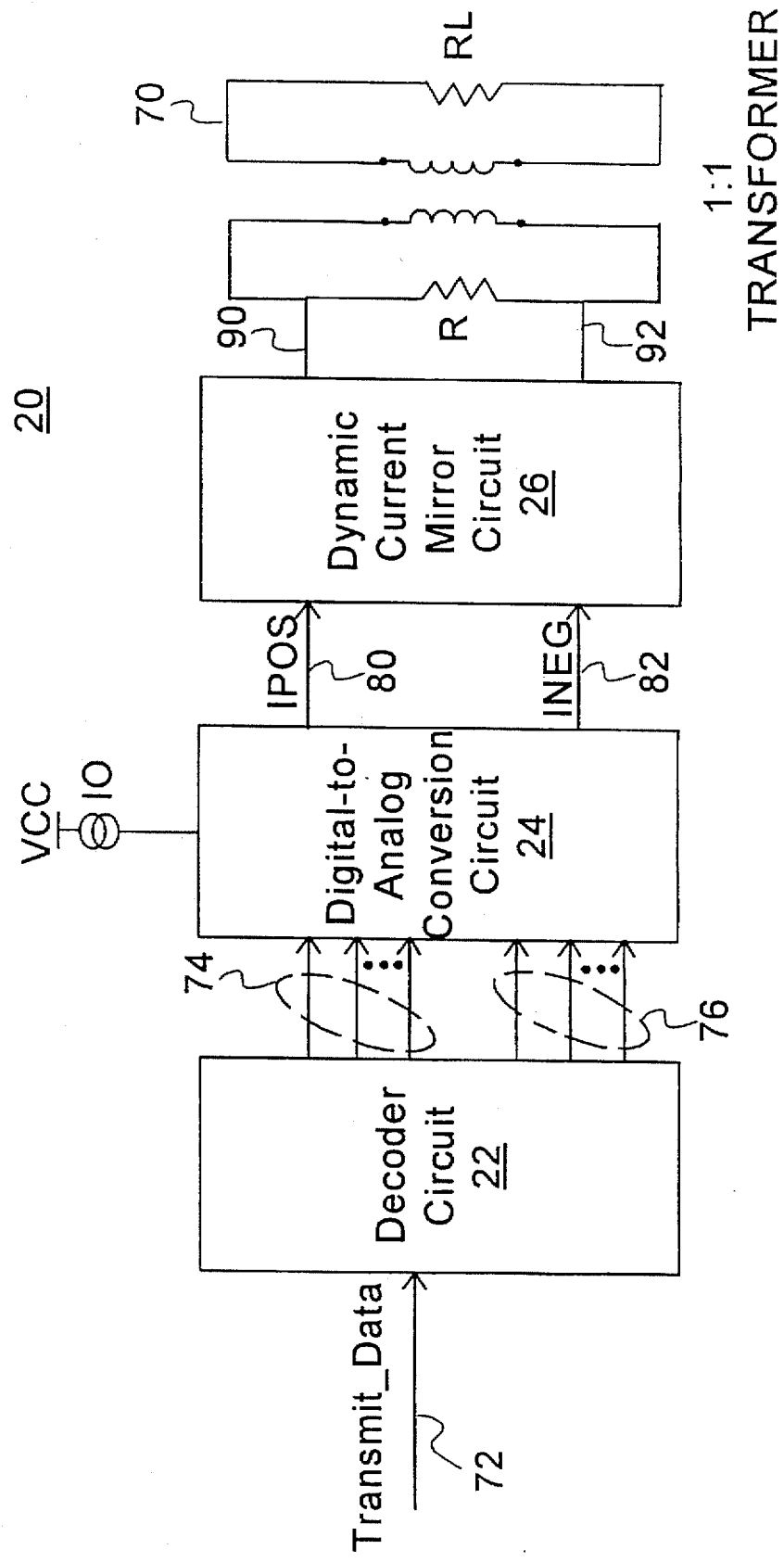
FIG. 1 illustrates a transmission system having digital to analog conversion with dynamic current mirroring.

FIG. 1 illustrates a transmission system 20 having digital to analog conversion with dynamic current mirroring. The transmission system 20 in one embodiment includes a decoder circuit 22, a digital to analog conversion circuit 24, and a dynamic current mirror circuit 26.

The decoder circuit 22 receives a transmit_data signal 72 and performs a wave shaping function to synthesize a waveform. The synthesized analog signal carries the information contained in the transmit data signal 72. The decoder circuit 22 generates sets of wave shaping data signals 74 and 76 that provide digital samples of the synthesized waveform. The wave shaping data signals 74 carry the digital samples corresponding to positive portions of the synthesized waveform. The wave shaping data signals 76 carry the digital samples for the negative portions of the synthesized waveform.

The digital to analog conversion circuit 24 includes circuitry that independently generates an IPOS electrical current and an INEG electrical current. The IPOS and the INEG electrical currents represent the positive and negative portions, respectively, of a synthesized waveform. The digital to analog conversion circuit 24 is coupled to a current source I0 that provides a current source for the IPOS and the INEG electrical currents.

The dynamic current mirror circuit 26 receives the IPOS and the INEG electrical currents via the signal lines 80 and 82. The dynamic current mirror circuit 26 combines and performs current amplification on the IPOS and the INEG and drives a load transistor R coupled between a node 90 and a node 92. The current amplification provided by the dynamic current mirror circuit 26 is sufficient to drive the IPOS and the INEG portions of the synthesized waveform over a transmission line 70 through a 1 to 1 transformer.

Figure 2:
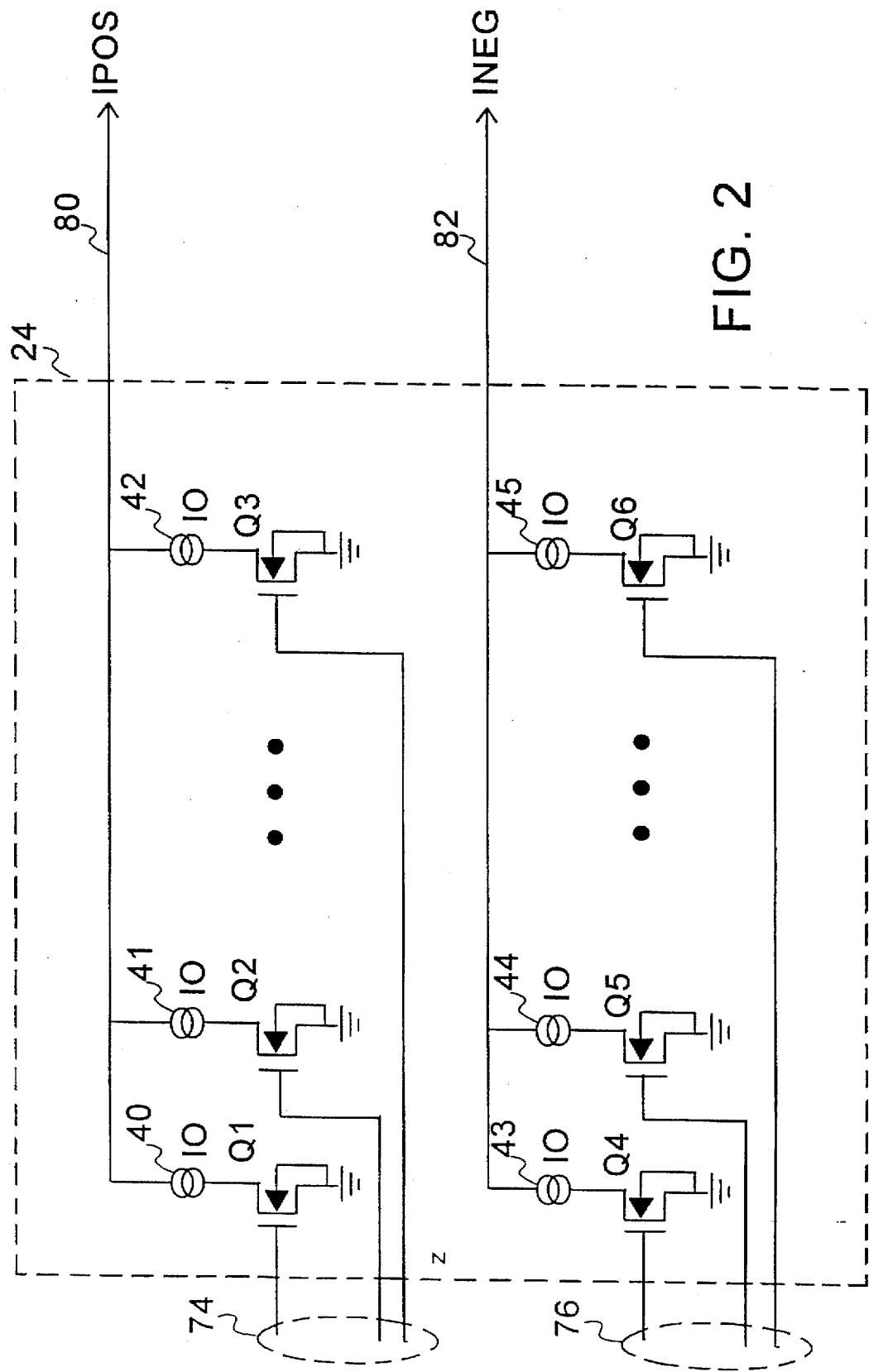
FIG. 2 illustrates the digital to analog conversion circuit which includes independent positive and negative single ended analog to digital conversion elements.

FIG. 2 illustrates the digital to analog conversion circuit 24 in one embodiment. The digital to analog conversion circuit 24 includes a set of transistors Q1-Q3 and a set of current mirror circuits 40-42 that provide a positive portion of a single ended analog to digital conversion function. The digital to analog conversion circuit 24 includes a set of transistors Q4-Q6 and a set of current mirror circuits 43-45 that provide an independent negative portion of a single ended analog to digital conversion function.

Each of the current mirror circuits 40-45 duplicates the supply current I0. The transistors Q1-Q6 function as switches that are responsive to the wave shaping data signals 74 and 76. The transistors Q1-Q6 independently switch on and off the current mirror circuits 60-65 according to the digital samples carried by the wave shaping data signals 74 and 76. The switched on current mirror circuits 40-45 yields a sum of currents at the node 80 and provides the IPOS electrical current. The switched on current mirror circuits 43-45 yields a sum of currents at the node 82 that provides the INEG electrical current.

Figure 3:
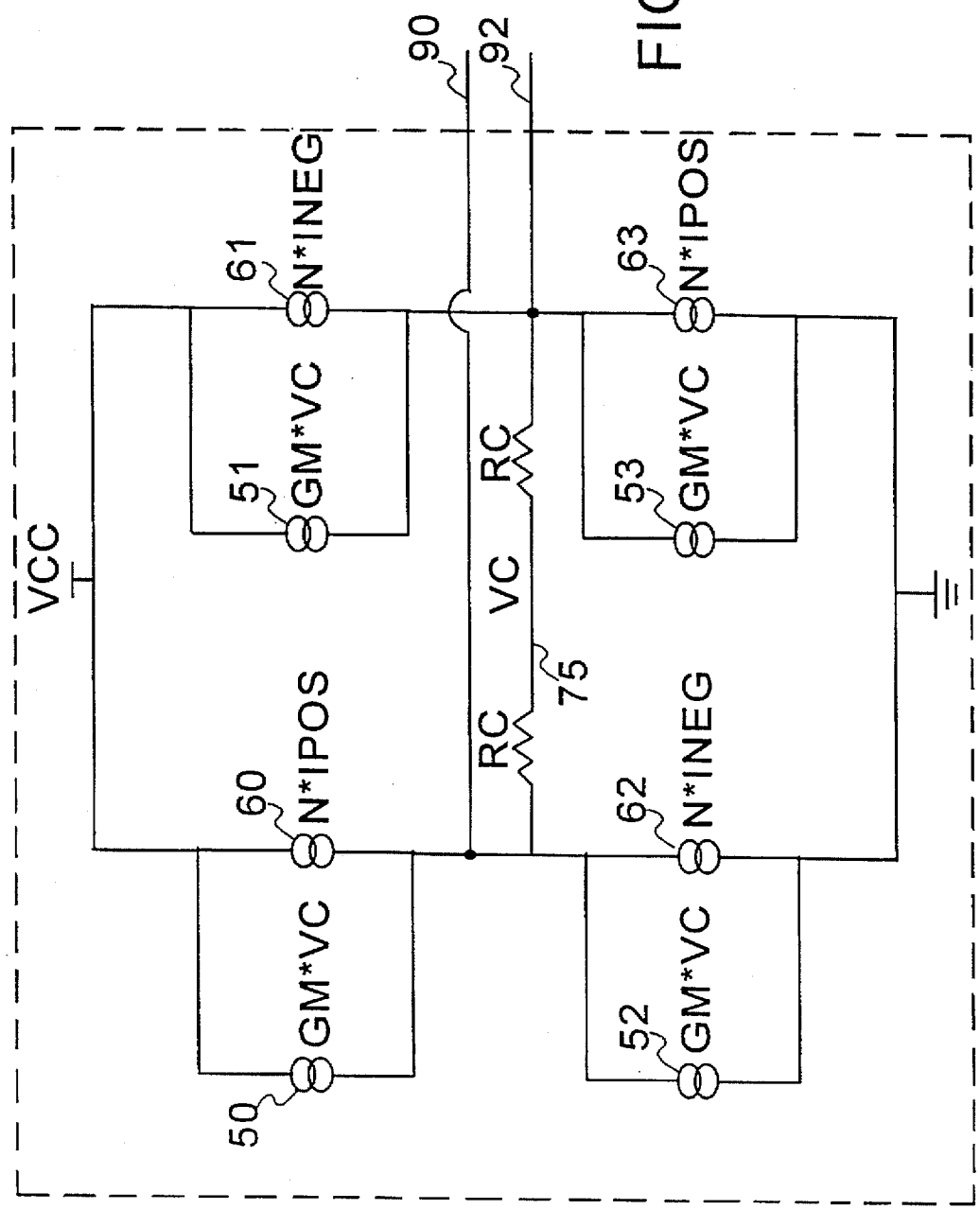
FIG. 3 illustrates the circuit functions implemented in the dynamic current mirror circuit.

FIG. 3 illustrates the circuit functions implemented in the dynamic current mirror circuit 26. The dynamic current mirror circuit 26 includes multiple sets of current mirrors 60-63. The sets of current mirrors 60-63 amplify the IPOS and the INEG electrical currents and provide positive and negative electrical current flow for the synthesized analog waveform through the resistor R. The current mirrors 60 comprise a set of N current mirrors, each of which duplicates the IPOS electrical current available on the signal line 80. Similarly, the current mirrors 63 comprise a set of N current mirrors, each of which duplicates the IPOS electrical current. While the IPOS electrical current on the signal line 80 is active, an amplified IPOS electrical current flows from the current mirrors 60 through the output node 90, through the resistor R and back through the output node 92 to the current mirrors 63.

The current mirrors 61 and the current mirrors 62 each include a set of N current mirrors that each duplicate the INEG electrical current available on the signal line 82. While the INEG electrical current on the signal line 82 is active, an amplified INEG electrical current flows from the current mirrors 61 through the output node 92, through the resistor R and back through the output node 90 to the current mirrors 62.

Figure 4A:
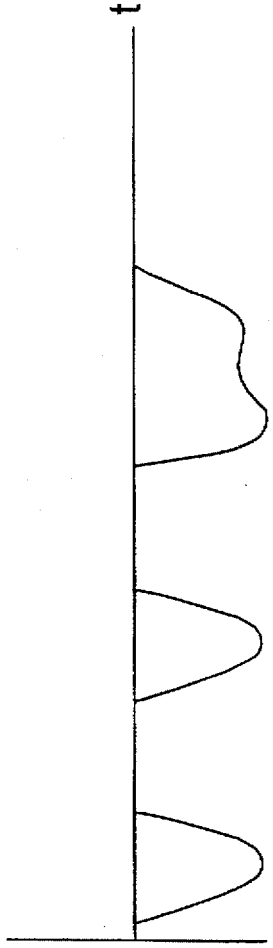
FIGS. 4a–4b illustrate examples of the IPOS and the INEG electrical currents, respectively.
Figure 4B:
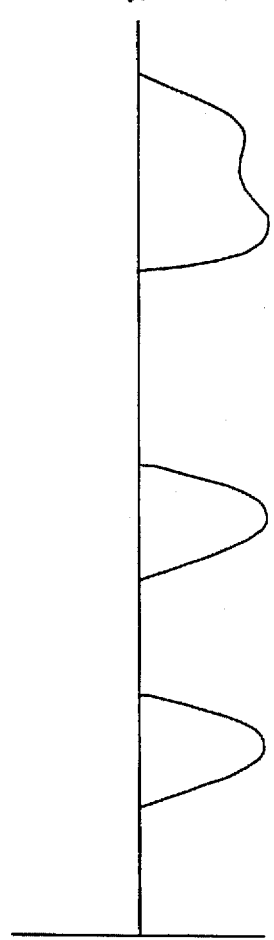
Figure 4C:
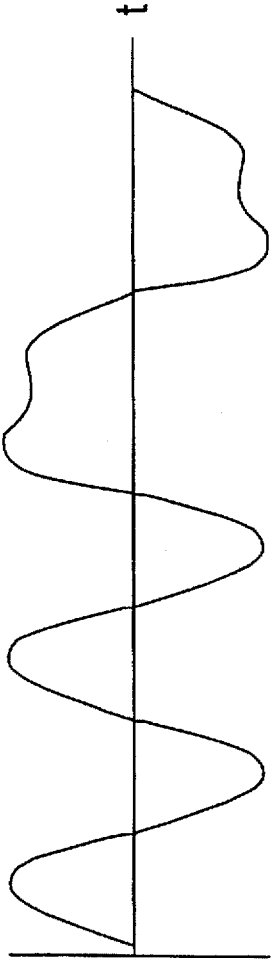
FIG. 4c illustrates the resulting synthesized waveform.

FIGS. 4a and 4b illustrate the IPOS and the INEG electrical currents, respectively, on the signal lines 80 and 82 for an example synthesized waveform. The IPOS and the INEG electrical currents flow in the same direction at the signal lines 80 and 82. FIG. 4c illustrates the resulting amplified electrical current flow through the resistor R. The output voltage across the resistor R provides the synthesized analog waveform transmitted over the transmission line 70.

Referring again to FIG. 3, the dynamic current mirror circuit 26 also includes a set of transconductance amplifiers 50-53. Each of the transconductance amplifiers 50-53 senses a common mode voltage VC at a node 75. The transconductance amplifiers 50 and 51 implement a negative transconductance factor $G_m$ and the transconductance amplifiers 52 and 53 implement a positive transconductance factor $G_m$.

If the common mode voltage VC at the node 75 increases, then the current from the amplifiers 52 and 53 each increase and the current from the amplifiers 50 and 51 each decrease, thereby decreasing the common mode voltage VC. If the common mode voltage VC decreases, then the current from the amplifiers 52 and 53 decrease while the current from the amplifiers 50 and 51 increase, which causes an increase in the common mode voltage VC. Taken together, the current sources 50-53 improve output linearity of the dynamic current mirror circuit 26 and decrease the common mode output voltage VC at the node 75.

Figure 5:
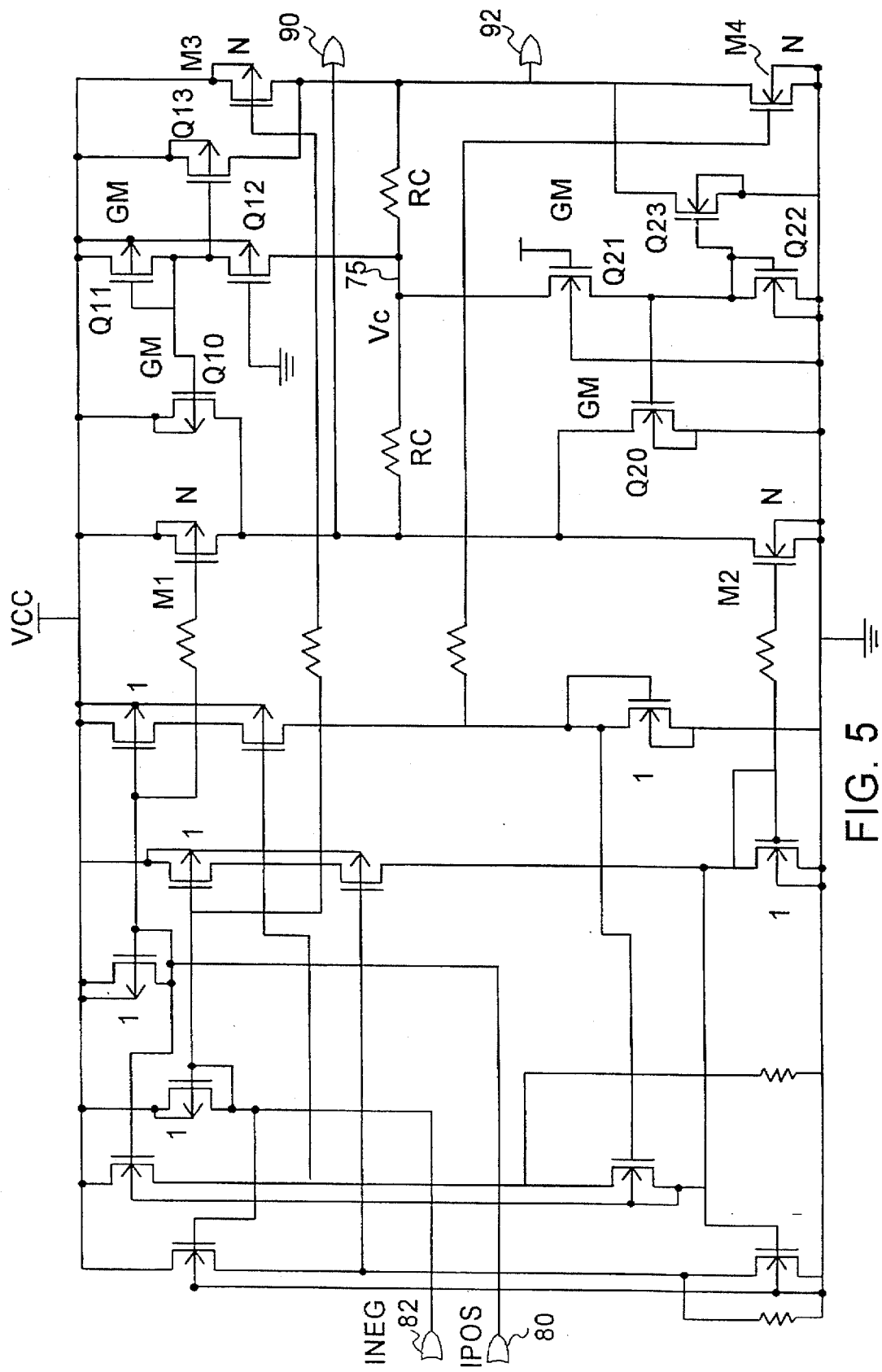
FIG. 5 provides detailed schematics of one embodiment of the dynamic current mirror circuit.

FIG. 5 provides detailed schematics of one embodiment of the dynamic current mirror circuit 26. In this embodiment, the N current mirrors 60 are represented by a current mirror arranged transistor M1. The N current mirrors 62 are represented by a current mirror arranged transistor M2. The N current mirrors 61 are represented by a current mirror arranged transistor M3 and the N current mirrors 63 are represented by a current mirror arranged transistor M4. The positive transconductance amplifier includes a set of transistors Q10-Q13. A negative transconductance amplifier includes a set of transistors Q20-Q23.

The foregoing detailed description of the present invention is provided for the purposes of illustration and is not intended to be exhaustive or to limit the invention to the precise embodiment disclosed. Accordingly the scope of the present invention is defined by the appended claims.

What is claimed is:

1. A digital to analog conversion circuit, comprising:
   circuitry for converting a sequence of positive digital data samples into a first electrical current and for converting a sequence of negative digital data samples into a second electrical current;
   current mirror circuitry that generates an analog waveform by combining and amplifying the first and second electrical currents.

* * * * *